(12) United States Patent
Spehar et al.

(10) Patent No.: US 6,693,780 B2
(45) Date of Patent: Feb. 17, 2004

(54) ESD PROTECTION DEVICES FOR A DIFFERENTIAL PAIR OF TRANSISTORS

(75) Inventors: James R Spehar, Albuquerque, NM (US); Roy A Colclaser, Albuquerque, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 291 days.

(21) Appl. No.: 09/922,416

(22) Filed: Aug. 2, 2001

(65) Prior Publication Data

US 2003/0026052 A1 Feb. 6, 2003

(51) Int. Cl.[7] .............................. H02H 9/00; H03F 3/45
(52) U.S. Cl. ........................ 361/56; 330/261; 330/296
(58) Field of Search .................... 361/56, 91.1, 111; 330/261, 296, 307; 323/289

(56) References Cited

U.S. PATENT DOCUMENTS

| 4,206,418 A | | 6/1980 | Dingwall | |
| 4,390,812 A | * | 6/1983 | Seidler | 323/289 X |
| 4,717,888 A | * | 1/1988 | Vinn et al. | 330/261 |
| 5,311,083 A | | 5/1994 | Wanlass | 307/475 |

FOREIGN PATENT DOCUMENTS

EP 0388896 A 9/1990

* cited by examiner

*Primary Examiner*—Jessica Han

(57) ABSTRACT

The invention provides a way of protecting a differential pair of transistors by providing a current path between input terminals of the transistors, while limiting the voltage across reversed biased junctions of the transistors. The invention also allows a larger swing of input voltage at the input terminals of the transistors. According to the present invention, an electrostatic discharge protection circuit is provided for protecting a differential pair of transistors. Each transistor includes first and second terminals and an input terminal. The second terminals of the transistors are connected to each other. The circuit comprises a pair of bypassing circuits and a clamping circuit. Each bypassing circuit is connected in parallel with a junction formed by the input and second terminals of an associated one of the transistors to limit a voltage across the junction when the junction is reverse biased. The clamping circuit is connected in parallel with the two input terminals of the transistors for setting an allowed differential voltage swing between the input terminals to a predetermined level.

20 Claims, 4 Drawing Sheets

ESD PROTECTION DEVICES FOR A DIFFERENTIAL PAIR OF TRANSISTORS

BACKGROUND OF THE INVENTION

The invention generally relates to electronic protection devices, and more particularly to electrostatic discharge (ESD) protection devices for a differential pair of transistors.

Integrated circuits are susceptible to a variety of reliability problems. One of these issues is the possible vulnerability to ESD events. ESD occurs when a charged object, e.g., a piece of equipment used to install integrated circuits into a printed circuit board, is brought into close proximity to a pin of an integrated circuit that is at a different potential compared to the charged object. The discharge consists, typically, of current levels exceeding an ampere during a time period less than 200 nanoseconds. The magnitude of the peak current and the wave shape of the discharge depend on the effective resistance, capacitance and inductance of the system and the amount of charge present before the discharge. The result of ESD on unprotected integrated circuits is often destruction characterized by melting and/or explosion of part of the circuit. It is common practice for the designer to include extra components in an integrated circuit that are intended to provide protection against ESD damage by providing paths for the ESD events that bypass the components used for the normal circuit functions and are not destroyed by the ESD events.

In BiCMOS integrated circuits, a frequently used circuit configuration is a differential pair 10 of bipolar transistors, as shown in FIG. 1. When this configuration is used as an input with the bases of the transistors connected to external bonding pads, it is very difficult to protect these transistors from ESD events.

A typical ESD protection scheme is shown in FIG. 2. If pad A is stressed positive with respect to pad B, one of the likely paths for the ESD current is through a resistor R1, the forward biased base-emitter junction BE-1, the reverse biased base-emitter junction BE-2, and a resistor R2. In high frequency integrated circuits, transistors Q1 and Q2 are small in area, significantly limiting the ability of the base-emitter junction to carry current in the forward direction before the internal power dissipation is sufficient to cause damage. The base-emitter junction is very weak in the reverse direction, with a typical breakdown voltage of 4 V or less. Resistors R1 and R2 are often low-valued resistors to improve performance. The result of this configuration is that it is very difficult to protect the differential pair against the effects of ESD events.

The ESD protection scheme shown in FIG. 2 is required to limit the voltage between points C and D to a safe value during a typical ESD event, where the discharge current may exceed 2 A. For high forward currents, the internal series resistance of the diode results in a larger forward drop (typically 2 to 3 V) than the typical low current diode drop (0.7 V). The preferred current path would be through diode D1, a power supply clamp 12, and diode D4. If it is assumed that the voltage drop across power supply clamp 12 is 5 V, and the voltage across each of the two diodes in forward bias under the ESD event is 3 V, then 11 V appears from pad A to pad B. Also, if it is assumed that the current through the reverse biased BE-2 is limited to 10 $\mu$A with a voltage drop of 4 V and that the voltage drop across the forward biased BE-1 is 0.6 V at 10 $\mu$A, then the voltage drop across resistor R1 plus resistor R2 must be 6.4 V at 10 $\mu$A. The result is that R1 and R2, which are equal, must be at least 320 k$\Omega$ to protect the device. For high performance, it may be necessary to limit R1 and R2 to less than 100$\Omega$ each. Note that it may be necessary to limit the current through the reverse biased base-emitter junctions to 1 $\mu$A or less for very small devices. An alternative is to increase the physical size of the transistors, which degrades the performance, to improve ESD protection.

An alternative approach is to divert the current from the input pads A and B directly. One such approach is shown in FIG. 3, where anti-parallel diodes, D5 and D6, are connected between pads A and B. This approach limits the voltage across the differential pair to one high current diode drop (approximately 3 V), if the same assumptions as in the above for FIG. 2 are used. Note that the other diodes are also necessary to provide protection for ESD stresses from the pads to the power supply and ground. The major difficulty with this approach is that the input signal current is also partially diverted by the diode pair D5 and D6, limiting the input voltage swing to approximately 0.6 V in either polarity. If the input swing is larger than 0.6 V, the anti-parallel diodes D5 and D6 are no longer a valid solution for ESD protection.

Therefore, there is a need for an effective ESD protection scheme that allows a larger input voltage swing.

SUMMARY OF THE INVENTION

The invention provides a way of protecting a differential pair of transistors by providing a current path between input terminals of the transistors, while limiting the voltage across reversed biased junctions of the transistors. The invention also allows a larger input voltage swing at the input terminals of the transistors.

According to the present invention, an electrostatic discharge protection circuit is provided for protecting a differential pair of transistors. Each transistor includes first and second terminals and an input terminal. The second terminals of the transistors are connected to each other. The circuit comprises a pair of bypassing circuits and a clamping circuit. Each bypassing circuit is connected in parallel with a junction formed by the input and second terminals of an associated one of the transistors to limit a voltage across the junction when the junction is reverse biased. The clamping circuit is connected in parallel with the two input terminals of the transistors for setting an allowed differential voltage swing between the input terminals to a predetermined level.

According to one embodiment of the invention, the clamping circuit is connected between the input terminals of the transistors.

According to another embodiment of the invention, the clamping circuit is connected between two external pads which are respectively connected to the input terminals of the transistors.

In a specific embodiment of the invention, the clamping circuit includes a set of anti-parallel diodes and each bypass circuit includes a diode that is connected in parallel with the junction of the associated transistor.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE PREFERRED EMBODIMENTS

Figure 1:
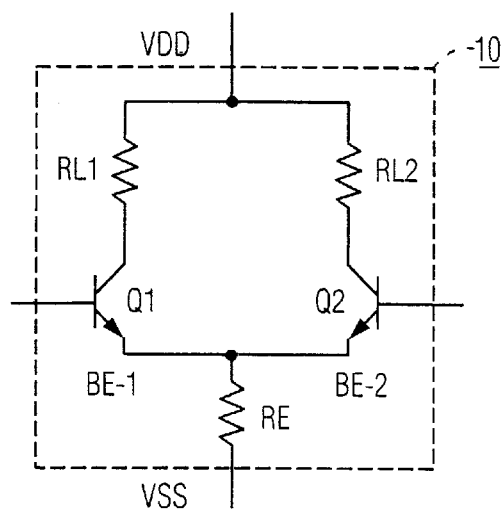
FIG. 1 shows a conventional differential pair of bipolar transistors.
Figure 2:
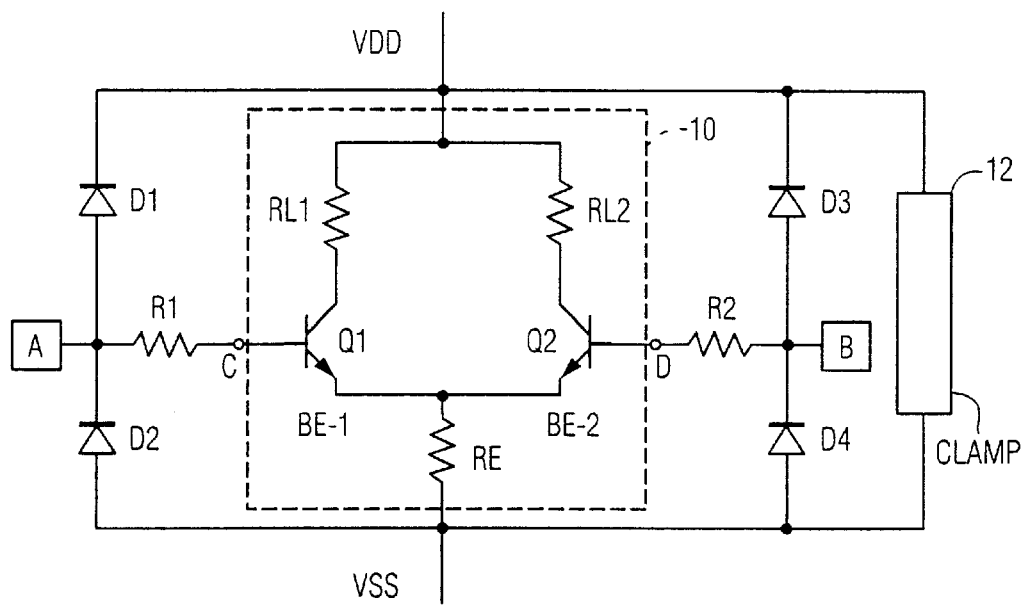
FIG. 2 shows a typical conventional ESD protection scheme.
Figure 3:
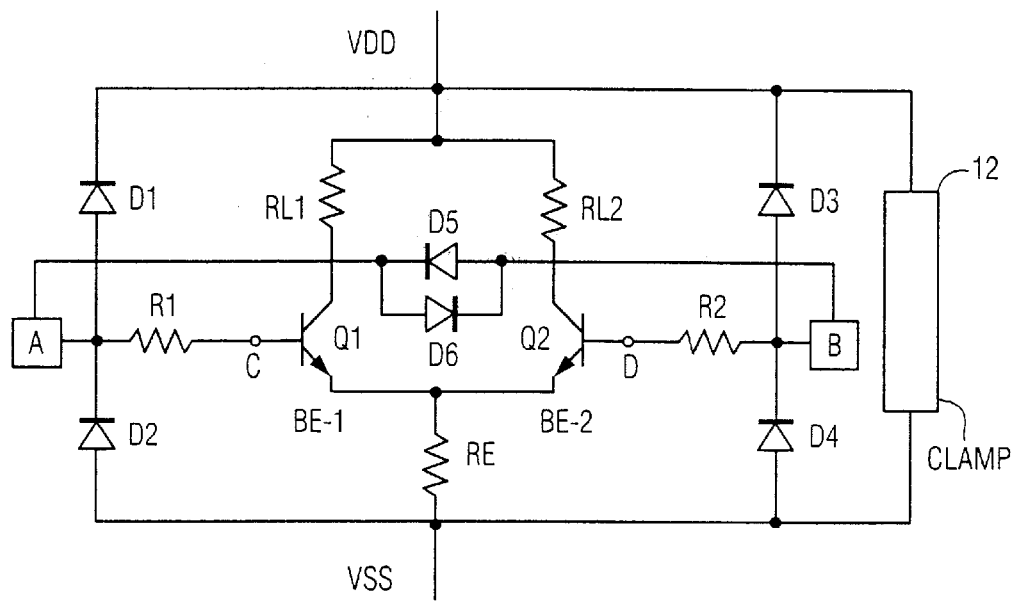
FIG. 3 shows an alternative conventional ESD protection scheme.
Figure 4:
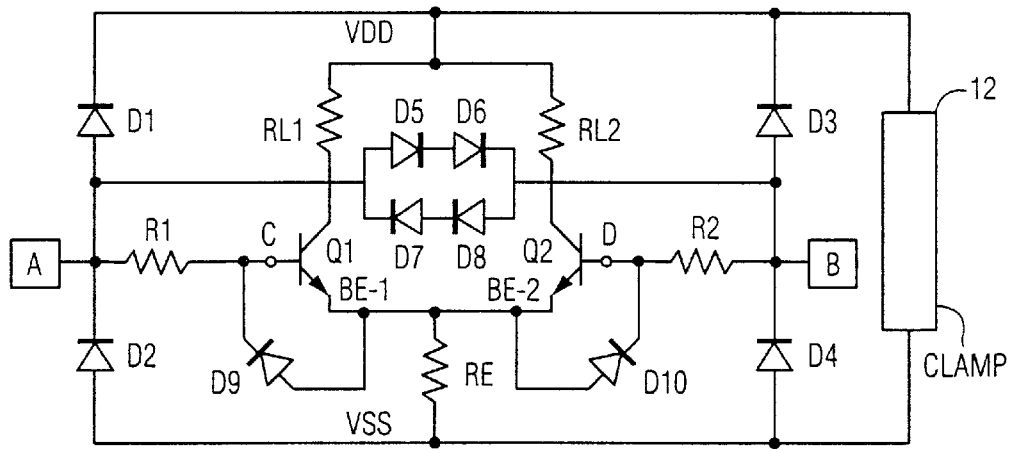
FIG. 4 shows an ESD protection scheme according to a first embodiment of the invention.

FIG. 4 shows an ESD protection scheme that includes forward biased diodes D9 and D10 and anti-parallel diodes D5–D8, according to a first embodiment of the invention. Diodes D9 and D10 each function as a circuit branch to allow current to bypass the base-emitter junctions BE-1 and BE-2 of transistors Q1 and Q2 when these junctions are reverse biased during ESD events. For example, in FIG. 4, forward biased diode D10 clamps the reverse biased diode voltage across BE-2 in a positive stress from pad A to pad B. If D10 were not there, then BE-2 would absorb most of the ESD voltage and eventually be damaged or destroyed. A path of forward biased diodes from point C to point D via BE-1 and D10 allows current to flow from pad A to pad B, which distributes the ESD voltage more uniformly across BE-1 and BE-2. Without this path, the junctions would eventually be damaged or destroyed, resulting in a change in the circuit performance.

There are several possible embodiments for the invention. In FIG. 4, the diode combination D5–D8 is connected directly between pads A and B. In this embodiment, diodes D5–D8 are the primary protection path for ESD events of either polarity between these two pads A and B. The diode-clamp combination D1–D4 and 12 provides protection for ESD events between pad A and VDD or VSS and between pad B and VDD or VSS of either polarity. For the embodiment in FIG. 4, the voltage drop from A to B, resulting from an ESD event, is limited to approximately 6 V with pad A positive with respect to pad B. This voltage also appears across R1, the parallel combination of BE-1 and D9, the parallel combination of BE-2 and D10, and R2. This event then results in a forward biased BE-1 and a forward biased D10. The current through these devices is limited by R1 and R2, the forward voltage drops across BE-1 and D10, and the total voltage from A to B (6 V in this case). Depending on the size of R1 and R2, this current can be considerably less than the current through D5 and D6. Diodes D5–D8 must be large enough to absorb the ESD event without destruction.

Figure 5A:
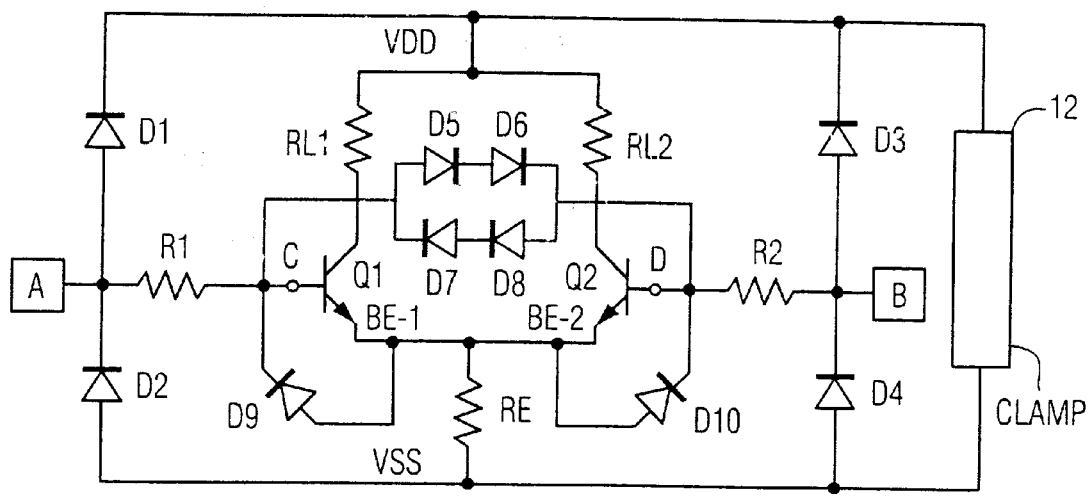
FIG. 5A shows an ESD protection scheme according to a second embodiment of the invention.

A different situation exists in a second embodiment shown in FIG. 5A. In this case, the D5–D8 combination is connected between C and D. The primary ESD protection provided by diodes D1–D4 and clamp 12 is also used to protect for ESD events between pads A and B. For pad A positive with respect to pad B, part of the current goes through R1, the parallel paths of (1) D5–D6 and (2) BE-1 and D10, and R2. To divert the ESD event into the primary protection elements, the voltage from pad A to pad B must rise to the point where most of the current from the ESD event follows the path through D1, clamp 12, and D4. This situation occurs when there is sufficient voltage drop across R1 and R2. For large values of R1 and R2, diodes D5–D10 (and BE-1 and BE-2) can be relatively small in area (and capacitance) for adequate ESD protection. For small values of R1 and R2, more of the ESD event must be absorbed by the D5–D10 (and BE-1 and BE-2).

Figure 5B:
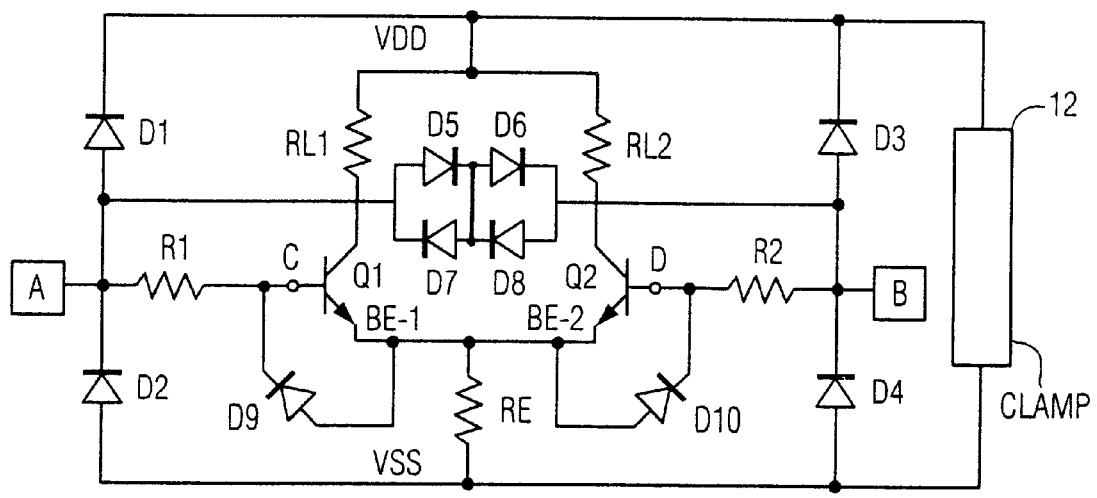
FIG. 5B shows a variation of the second embodiment in FIG. 5A.

FIG. 5B shows a variation of the third embodiment in FIG. 5A. As shown in FIG. 5B, each pair of anti-parallel diodes can be individually connected between the anodes of D6 and D7 and likewise the cathodes of D5 and D8 without changing the electrical of performance of the ESD protection. This is true for any configuration of anti-parallel, which are connected in series.

In both FIGS. 4, 5A and 5B above, the number of diodes can be increased to increase the allowed differential voltage swing at input pads A and B, but the number of forward biased diodes in each parallel path should be matched. If they are not matched, the input current will be diverted into the path with the lesser number of forward biased diodes, resulting in no improvement in allowed voltage swing. In FIG. 4, for example, two diodes, D5 and D6 from pad A to pad B are matched with two parallel diodes, BE-1 and D10 between points C and D. The number of diodes needed from pad A to pad B is determined by the maximum differential voltage on input pads A and B. This number should be matched by the combination of all diodes between points C and D, as explained above.

Figure 6:
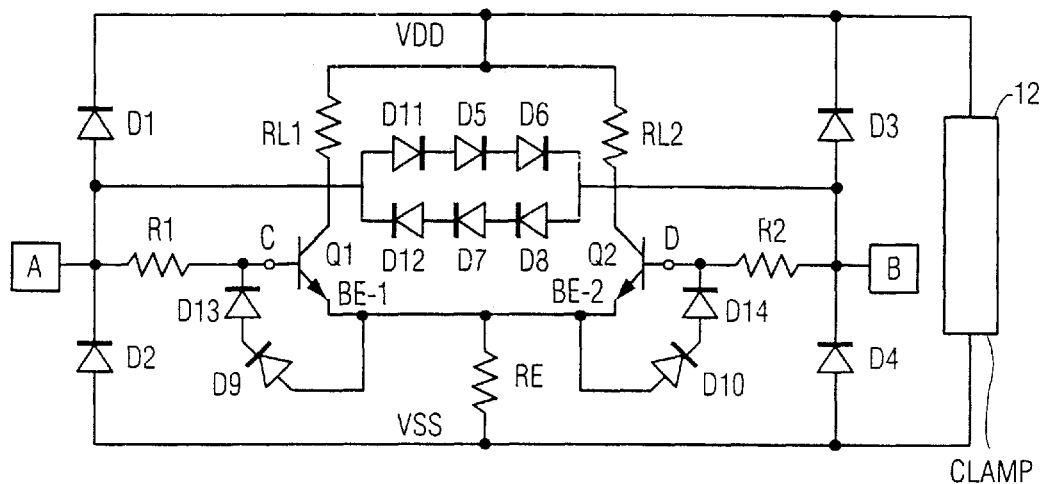
FIG. 6 shows an ESD protection scheme according to a third embodiment of the invention.

An example is illustrated with a third embodiment of the invention as shown in FIG. 6. In FIG. 6, if the maximum differential voltage swing on input pads A and B is 1.5 V, three diodes, D11, D5, and D6 (roughly 0.5–0.6V per diode) would be required from point A to point B to prevent significant diversion of the input signal through these diodes. In such case, three matching diodes would be needed from point C to point D, i.e., BE-1, D10 and D14, as shown in FIG. 6. In a similar manner, BE-2, D9 and D13 provide the path in the other direction to match the three parallel diodes D12, D7 and D8. The BE-1 and BE-2 junctions are then protected during an ESD event and the performance of the differential inputs is therefore preserved.

Figure 7:
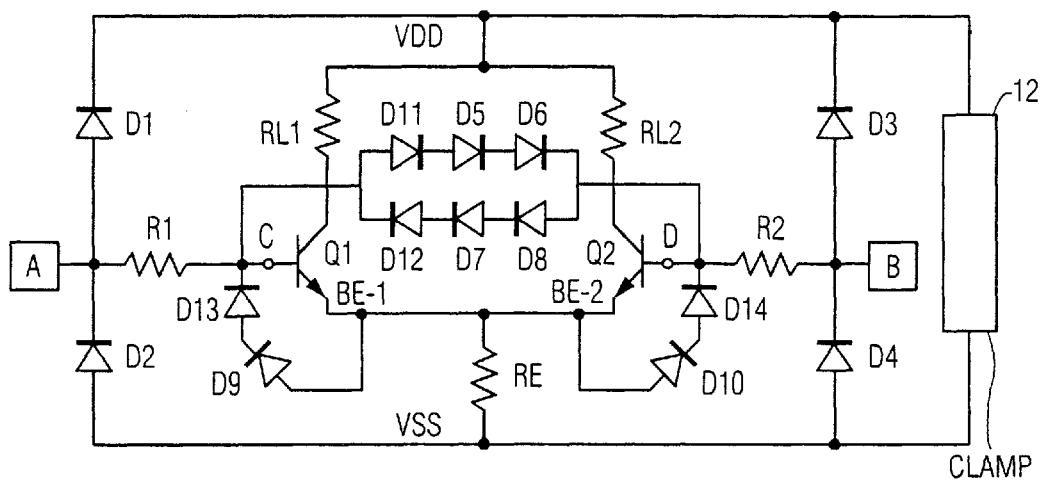
FIG. 7 shows an ESD protection scheme according to a fourth embodiment of the invention.

FIG. 7 shows a fourth embodiment of the invention. This embodiment is similar to that in FIG. 6, except that the anti-parallel diodes D5–D8, D11 and D12 are connected between points C and D instead of pads A and B.

The present invention is useful for protecting circuits in which the input signal is differential in nature, including, for example, differential amplifiers, emitter coupled logic, current mode logic, and comparators.

While the invention has been described in conjunction with specific embodiments, it is evident that many alternatives, modifications and variations will be apparent to those skilled in the art in light of the foregoing description. For example, the invention may be used to protect differential amplifiers composed of PNP bipolars. Also, devices that show a diode-like characteristic, i.e. conduct current in one polarity and block current in the opposite polarity, could be used in place of diodes D9, D10, D13 and D14 in the above embodiments of the invention. Accordingly, it is intended to embrace all such alternatives, modifications and variations as fall within the spirit and scope of the appended claims.

What is claimed is:

1. An electrostatic discharge protection circuit for protecting a differential pair of transistors, each transistor including first and second terminals and an input terminal, the second terminals of the transistors being connected to each other, the circuit comprising:
   a pair of bypassing circuits each connected in parallel with a junction formed by the input and second terminals of an associated one of the transistors and limiting a voltage across the junction when the junction is reverse biased; and
   a clamping circuit connected in parallel with the two input terminals of the transistors for setting an allowed differential voltage swing between the input terminals to a predetermined level.

2. The circuit of claim 1, wherein the clamping circuit is connected between the input terminals of the transistors.

3. The circuit of claim 1, wherein the clamping circuit is connected between two external pads which are respectively connected to the input terminals of the transistors.

4. The circuit of claim 1, wherein the clamping circuit includes a set of anti-parallel diodes.

5. The circuit of claim 4, wherein in the set of anti-parallel diodes the number of diodes connected allowing current to flow in a first direction is equal to the number of diodes connected allowing current to flow in a second direction opposite to the first direction.

6. The circuit of claim 1, each of the bypass circuits includes a diode that is connected in parallel with the junction of the associated transistor and allows current to bypass the junction if the junction is reverse biased.

7. The circuit of claim 6, wherein the clamping circuit includes a set of anti-parallel diodes, and wherein the number of forward biased diodes in the set of anti-parallel diodes is equal to the number of the forward biased diodes in the bypassing circuits plus an equivalent forward biased diode formed by the junction of the input and second terminals one of the transistors.

8. The circuit of claim 1, wherein the first and second terminals are collector and emitter terminals respectively, and the input terminal is a base terminal.

9. An electrostatic discharge protection circuit for protecting a differential pair of transistors, each transistor including first and second terminals and an input terminal, the second terminals of the transistors being connected to each other, the circuit comprising:
   a pair of bypassing means each, connected in parallel with a junction formed by the input and second terminals of an associated one of the transistors, for limiting a voltage across the junction when the junction is reverse biased; and
   clamping means, connected in parallel with the two input terminals of the transistors, for setting an allowed differential voltage swing between the input terminals to a predetermined level.

10. The circuit of claim 9, wherein the clamping means includes a set of anti-parallel diodes.

11. The circuit of claim 9, each of the bypass means includes a diode that is connected in parallel with the junction of the associated transistor and allows current to bypass the junction if the junction is reverse biased.

12. The circuit of claim 9, wherein the first and second terminals are collector and emitter respectively, and the input terminal is a base terminal.

13. A differential amplifier circuit, comprising:
   a differential pair of transistors, each transistor including first and second terminals and an input terminal, the second terminals of the transistors being connected to each other; and
   an electrostatic discharge protection circuit including:
      a pair of bypassing circuits each connected in parallel with a junction formed by the input and second terminals of an associated one of the transistors and limiting a voltage across the junction when the junction is reverse biased, and
      a clamping circuit connected in parallel with the two input terminals of the transistors for setting an allowed differential voltage swing between the input terminals to a predetermined level.

14. The circuit of claim 13, wherein the clamping circuit is connected between the input terminals of the transistors.

15. The circuit of claim 13, wherein the clamping circuit is connected between two external pads which are respectively connected to the input terminals of the transistors.

16. The circuit of claim 13, wherein the clamping circuit includes a set of anti-parallel diodes.

17. The circuit of claim 13, each of the bypass circuits includes a diode that is connected in parallel with the junction of the associated transistor and allows current to bypass the junction if the junction is reverse biased.

18. The circuit of claim 17, wherein the clamping circuit includes a set of anti-parallel diodes, and wherein the number of forward biased diodes in the set of anti-parallel diodes is equal to the number of the forward biased diodes in the bypassing circuits plus an equivalent forward biased diode formed by the junction of the input and second terminals one of the transistors.

19. The circuit of claim 18, wherein the first and second terminals are collector and emitter terminals respectively, and the input terminal is a base terminal.

20. A method for providing electrostatic discharge protection to a differential pair of transistors, each transistor including first and second terminals and an input terminal, the second terminals of the transistors being connected to each other, the method comprising the steps of:
   limiting a voltage across a junction formed by the input and second terminals of each of the transistors when the junction is reverse biased;
   providing a current path between the input terminals of the transistors; and
   setting an allowed differential voltage swing between the input terminals of the transistors to a predetermined level.

* * * * *